US011081568B2

(12) United States Patent
Yao et al.

(10) Patent No.: US 11,081,568 B2
(45) Date of Patent: Aug. 3, 2021

(54) PROTECTIVE BILAYER INNER SPACER FOR NANOSHEET DEVICES

(71) Applicant: International Business Machines Corporation, Armonk, NY (US)

(72) Inventors: Yao Yao, Albany, NY (US); Ruilong Xie, Niskayuna, NY (US); Andrew Greene, Slingerlands, NY (US); Veeraraghavan S. Basker, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 16/518,153

(22) Filed: Jul. 22, 2019

(65) Prior Publication Data
US 2021/0028297 A1 Jan. 28, 2021

(51) Int. Cl.
*H01L 21/82* (2006.01)
*H01L 29/66* (2006.01)
*H01L 21/306* (2006.01)
*H01L 29/08* (2006.01)
*H01L 29/40* (2006.01)
*H01L 21/311* (2006.01)
(Continued)

(52) U.S. Cl.
CPC .. *H01L 29/66553* (2013.01); *H01L 21/02532* (2013.01); *H01L 21/3083* (2013.01); *H01L 21/30604* (2013.01); *H01L 21/31111* (2013.01); *H01L 29/0673* (2013.01); *H01L 29/0847* (2013.01); *H01L 29/1037* (2013.01); *H01L 29/401* (2013.01); *H01L 29/6653* (2013.01); *H01L 29/6656* (2013.01); *H01L 29/66545* (2013.01); *H01L 29/66795* (2013.01); *H01L 29/785* (2013.01); *H01L 21/0262* (2013.01)

(58) Field of Classification Search
None
See application file for complete search history.

(56) References Cited

U.S. PATENT DOCUMENTS 9,461,114 B2  10/2016  Obradovic et al.
9,941,405 B2   4/2018  Kittl et al.
(Continued)

FOREIGN PATENT DOCUMENTS

CN   105679827 A   6/2016

*Primary Examiner* — Benjamin P Sandvik
(74) *Attorney, Agent, or Firm* — Randall Bluestone; Ryan, Mason & Lewis, LLP (57) ABSTRACT

A method for manufacturing a semiconductor device includes forming a plurality of first semiconductor layers alternately stacked with a plurality of second semiconductor layers on a semiconductor substrate, and laterally recessing the plurality of first semiconductor layers with respect to the plurality of second semiconductor layers to form a plurality of vacant areas on lateral sides of the plurality of first semiconductor layers. In the method, a plurality of first inner spacers are formed on the lateral sides of the plurality of first semiconductor layers in respective ones of the plurality of vacant areas, and a plurality of second inner spacers are formed on sides of the plurality of first inner spacers in the respective ones of the plurality of vacant areas. The method also includes laterally recessing the plurality of second semiconductor layers, and growing a plurality of source/drain regions from the plurality of second semiconductor layers.

20 Claims, 10 Drawing Sheets

(51) Int. Cl.
*H01L 21/308* (2006.01)
*H01L 29/10* (2006.01)
*H01L 29/06* (2006.01)
*H01L 29/78* (2006.01)
*H01L 21/02* (2006.01)

(56) References Cited

U.S. PATENT DOCUMENTS

| | | | |
|---|---|---|---|
| 9,947,804 | B1 | 4/2018 | Frougier et al. |
| 9,954,058 | B1 * | 4/2018 | Mochizuki ......... H01L 29/42392 |
| 9,960,232 | B2 | 5/2018 | Obradovic et al. |
| 9,978,833 | B2 | 5/2018 | Kittl et al. |
| 10,008,583 | B1 | 6/2018 | Rodder et al. |
| 10,177,227 | B1 * | 1/2019 | Yoshida ................. B82Y 10/00 |
| 10,217,817 | B2 | 2/2019 | Chang et al. |
| 10,535,733 | B2 * | 1/2020 | Cheng .................... B82Y 10/00 |
| 10,679,906 | B2 * | 6/2020 | Cheng ................. H01L 29/4991 |
| 10,832,907 | B2 * | 11/2020 | Cheng ............... H01L 29/42392 |
| 2018/0294331 | A1 | 10/2018 | Cho et al. |

\* cited by examiner

PROTECTIVE BILAYER INNER SPACER FOR NANOSHEET DEVICES

BACKGROUND

Transistor devices may be, for example, fin field-effect transistor (FinFET), nanosheet or nanowire devices. In planar and FinFET technology, lateral silicon recessing prior to source/drain epitaxial formation has been performed to obtain controlled doping profiles under gate spacers. Since the silicon acts as a template for epitaxial growth, the quality of exposed silicon strongly influences the quality of the epitaxial growth. By recessing and etching back silicon channels, surface oxide and other surface defects are removed from surfaces where epitaxial growth occurs.

However, for nanosheet technology, lateral recessing of silicon channels causes issues when silicon germanium (SiGe) is removed from silicon/SiGe nanosheet stacks to form gate regions. For p-type field-effect transistors (PFETs), the release of the SiGe layers also removes part of SiGe source/drain regions, which are adjacent the recessed silicon channels and close enough to the SiGe layers being removed to be damaged by the etchant removing the SiGe layers.

SUMMARY

According to an exemplary embodiment of the present invention, a method for manufacturing a semiconductor device includes forming a plurality of first semiconductor layers alternately stacked with a plurality of second semiconductor layers on a semiconductor substrate, and laterally recessing the plurality of first semiconductor layers with respect to the plurality of second semiconductor layers to form a plurality of vacant areas on lateral sides of the plurality of first semiconductor layers. In the method, a plurality of first inner spacers are formed on the lateral sides of the plurality of first semiconductor layers in respective ones of the plurality of vacant areas, and a plurality of second inner spacers are formed on sides of the plurality of first inner spacers in the respective ones of the plurality of vacant areas. The method also includes laterally recessing the plurality of second semiconductor layers, and growing a plurality of source/drain regions from the plurality of second semiconductor layers.

According to an exemplary embodiment of the present invention, a semiconductor device includes a stacked structure disposed on a substrate. The stacked structure includes a plurality of gate structures alternately stacked with a plurality of channel layers. A plurality of spacers are disposed on lateral sides of the plurality gate structures. The device also includes a plurality of epitaxial source/drain regions extending from the plurality of channel layers, wherein portions of the plurality of epitaxial source/drain regions adjacent the plurality of channel layers are positioned between adjacent ones of the plurality of spacers.

According to an exemplary embodiment of the present invention, a method for manufacturing a semiconductor device includes forming a plurality of sacrificial semiconductor layers alternately stacked with a plurality of channel semiconductor layers on a semiconductor substrate, and laterally recessing the plurality of sacrificial semiconductor layers with respect to the plurality of channel semiconductor layers to form a plurality of vacant areas on lateral sides of the plurality of sacrificial semiconductor layers. In the method, a plurality of first inner spacers are formed on the lateral sides of the plurality of sacrificial semiconductor layers in respective ones of the plurality of vacant areas, and a plurality of second inner spacers are formed on sides of the plurality of first inner spacers in the respective ones of the plurality of vacant areas. The method also includes laterally recessing the plurality of channel semiconductor layers, and growing a plurality of source/drain regions from the plurality of channel semiconductor layers.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Exemplary embodiments of the invention will now be discussed in further detail with regard to semiconductor devices and methods of manufacturing same and, in particular, to formation of a bilayer inner spacer structure to protect source/drain regions during removal of SiGe nanosheet layers.

It is to be understood that the various layers and/or regions shown in the accompanying drawings are not drawn to scale, and that one or more layers and/or regions of a type commonly used in, for example, complementary metal-oxide semiconductor (CMOS), field-effect transistor (FET), nanowire FET, nanosheet FET, FinFET, metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, CMOSs, MOSFETs, nanowire FETs, nanosheet FETs and/or FinFETs. By way of non-limiting example, the semiconductor devices can include, but are not limited to FET, CMOS, MOSFET, nanowire FET, nanosheet FET and FinFET devices, and/or semiconductor devices that use FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Although embodiments of the present invention are discussed in connection with nanosheet stacks, the embodiments of the present invention are not necessarily limited thereto, and may similarly apply to nanowire stacks.

Figure 1A:
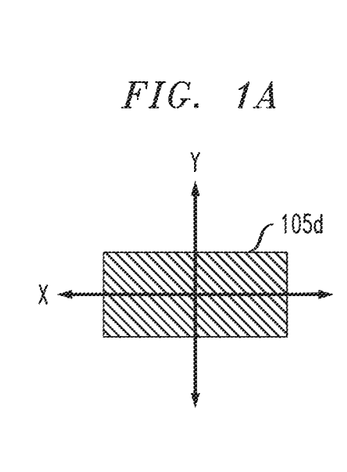
FIG. 1A is a schematic top view illustrating manufacturing of a semiconductor device and showing formation of a stacked structure of silicon germanium (SiGe) and silicon (Si) nanosheet layers, according to an embodiment of the invention.
Figure 1B:
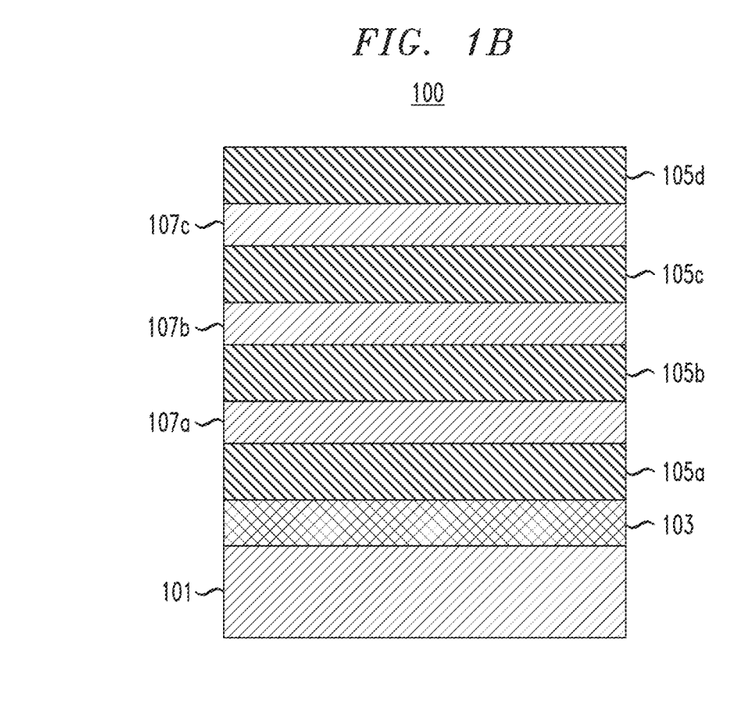
FIG. 1B is a schematic cross-sectional view taken along the line X in FIG. 1A illustrating manufacturing of a semiconductor device and showing formation of a stacked structure of SiGe and Si nanosheet layers, according to an embodiment of the invention.

FIGS. 1A and 1B are schematic top and cross-sectional views showing formation of a stacked structure of SiGe and Si nanosheet layers. Referring to FIGS. 1A and 1B, a semiconductor substrate 101 comprises semiconductor material including, but not limited to, silicon (Si), silicon germanium (SiGe), II-V, II-V compound semiconductor or other like semiconductor. In addition, multiple layers of the semiconductor materials can be used as the semiconductor material of the substrate.

In accordance with an embodiment of the present invention, processing may start with a pre-fabricated semiconductor-on-insulator structure comprising the isolation layer 103 pre-formed on the substrate layer 101, and the lower SiGe layer 105a pre-formed on an isolation layer 103. The isolation layer 103 may comprise, for example, silicon oxide ($SiO_x$) (where x is for example, 2, 1.99 or 2.01), silicon oxycarbide (SiOC), silicon oxycarbonitride (SiOCN) or some other dielectric. Alternatively, if a bulk substrate is used, a sacrificial semiconductor layer between the stacked structure of the SiGe layers 105a, 105b, 105c and 105d and Si layers 107a, 107b and 107c is removed using, for example, an aqueous solution containing ammonium hydroxide ($NH_4OH$) and hydrogen peroxide ($H_2O_2$) or a gas containing hydrogen fluoride (HCl). Following the removal of the sacrificial semiconductor layer, a dielectric layer is deposited using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), followed by an etch back to form the isolation layer 103 on the substrate 101.

Depending on whether a semiconductor-on-insulator structure or bulk substrate is used, layers of silicon germanium 105a, 105b, 105c and 105d and silicon 107a, 107b and 107c are epitaxially grown in an alternating and stacked configuration on the sacrificial semiconductor layer, or layers of silicon germanium 105b, 105c and 105d and silicon 107a, 107b and 107c are epitaxially grown in an alternating and stacked configuration on the lower SiGe layer 105a. In either case, a first SiGe layer 105a is followed by a first Si layer 107a on the first SiGe layer 105a, which is followed by a second SiGe layer 105b on the first Si layer 107a, and so on. As can be understood, the SiGe and Si layers are epitaxially grown from their corresponding underlying semiconductor layers.

While four SiGe layers 105a-d and three Si layers 107a-c are shown, the embodiments of the present invention are not necessarily limited to the shown number of layers 105, 107, and there may be more or less layers in the same alternating configuration depending on design constraints. The SiGe layers 105a-105d are also referred to herein as sacrificial semiconductor layers since, as described further herein, the layers 105a-105d are eventually removed and replaced by gate structures.

Although SiGe is described as a sacrificial material for layers 105a-105d, and Si is described as a nanosheet channel material for layers 107a-c, other materials can be used. For example, the channel material can be SiGe with a Ge % of 20% (SiGe20), and the sacrificial material can be SiGe with a Ge % of 60% (SiGe60). Layers 105a-105d have the property of being able to be removed selectively compared to the nanosheet channel material of layers 107a-107c.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a rapid thermal chemical vapor deposition (RTCVD), ultra-high vacuum chemical vapor deposition (UHVCVD), or a low pressure chemical vapor deposition (LPCVD) apparatus. A number of different sources may be used for the epitaxial deposition of the in situ doped semiconductor material. In some embodiments, the gas source for the deposition of an epitaxially formed semiconductor material may include silicon (Si) deposited from silane, disilane, trisilane, tetrasilane, hexachlorodisilane, tetrachlorosilane, dichlorosilane, trichlorosilane, and combinations thereof. In other examples, when the semiconductor material includes germanium, a germanium gas source may be selected from the group consisting of germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking.

In a non-limiting illustrative embodiment, a height of the SiGe layers 105a, 105b, 105c and 105d can be in the range of about 6 nm to about 15 nm depending on the application of the device. Also, in a non-limiting illustrative embodiment, silicon layers 107a-107c of the SiGe/Si nanosheet stack can be formed on SiGe layers 105a-105c by epitaxial growth. In accordance with an embodiment of the present invention, the layers 107a-107c can include the same or a similar composition to the substrate 101. In a non-limiting example, a height of the layers 107a-107c can be in the range of about 6 nm to about 15 nm depending on the desired process and application. In accordance with an embodiment of the present invention, each of the layers 107a-107c has the same or substantially the same composition and size as each other, and each of the layers 105a-105d has the same or substantially the same composition and size as each other.

Figure 2A:
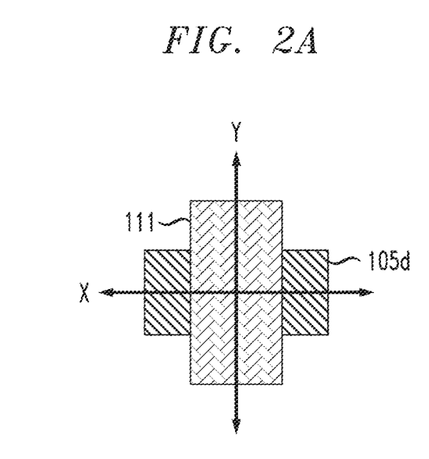
FIG. 2A is a schematic top view illustrating manufacturing of a semiconductor device and showing formation of a dummy gate structure and hardmask/spacer on the stacked structure, according to an embodiment of the invention.
Figure 2B:
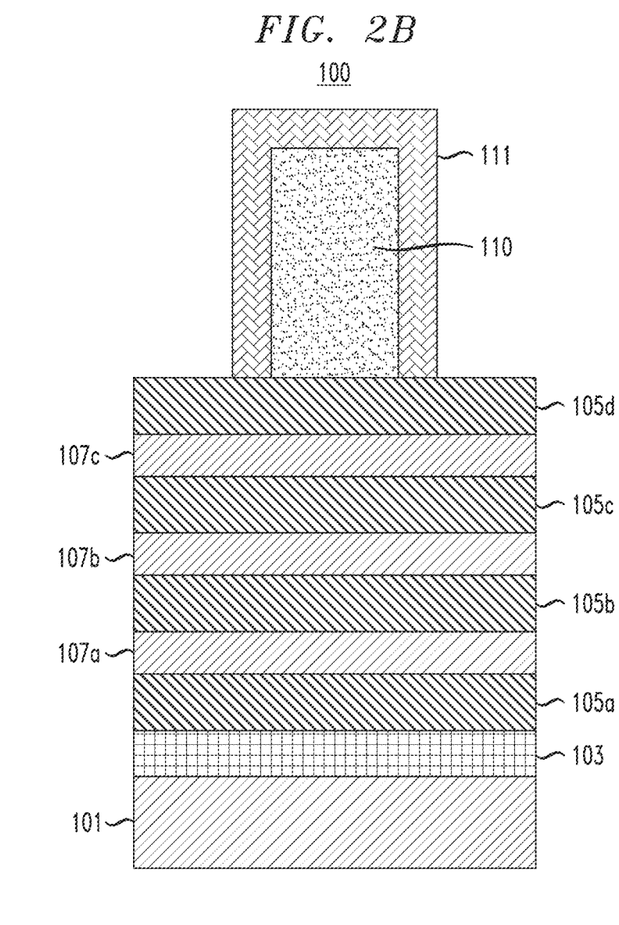
FIG. 2B is a schematic cross-sectional view taken along the line X in FIG. 2A illustrating manufacturing of a semiconductor device and showing formation of a dummy gate structure and hardmask/spacer on the stacked structure, according to an embodiment of the invention.

Referring to FIGS. 2A and 2B, a dummy gate structure including a dummy gate portion 110 and hardmask and spacer layers ("hardmask/spacer layer") 111 is deposited on and around the stacked configuration of Si and SiGe layers. The dummy gate portion 110 includes, but is not necessarily limited to, an amorphous silicon (a-Si) layer formed over a thin layer of $SiO_x$. The dummy gate portion 110 is deposited using deposition techniques such as, for example, CVD, PECVD, RFCVD, PVD, ALD, MBD, PLD, LSMCD, sputtering and/or plating, followed by a planarization process, such as, chemical mechanical polishing (CMP), and lithography and etching steps to remove excess gate material, and pattern the deposited layer.

A hardmask/spacer layer 111 is formed on top of and on sides of the dummy gate portion 110, and can be formed by one or more of the deposition techniques noted in connection with deposition of the dummy gate material. The hardmask and spacer material can comprise for example, one or more dielectrics, including, but not necessarily limited to, silicon nitride (SiN), silicon carbide (SiC), silicon oxynitride (SiON), SiOC, silicon-carbon-nitride (SiCN), boron nitride (BN), silicon boron nitride (SiBN), silicoboron carbonitride (SiBCN), SiOCN, $SiO_x$, and combinations thereof. According to an embodiment, the gate hardmask portion is formed on top of the dummy gate portion 110 and spacer portions are formed along lateral sides of the dummy gate portion 110. Hardmask and spacer portions can be the same material, such as, for example, SiN. Alternatively, the hardmask and spacer portions can be different materials, wherein the hardmask portion on top of the dummy gate portion 110 comprises SiN, and the spacer portion on lateral sides of the dummy gate portion 110 comprises SiOCN. For ease of explanation, the hardmask and spacer portions are shown as having the same material in layer 111. The hardmask/spacer layer 111 can be formed by any suitable techniques such as deposition followed by directional etching. Deposition may include but is not limited to, ALD or CVD. Directional etching may include but is not limited to, reactive ion etching (RIE).

For ease of the explanation, one dummy gate and hardmask/spacer structure is shown. However, the embodiments are not limited thereto, and multiple dummy gate and hardmask/spacer structures may be formed spaced apart from each other on a stacked structure of SiGe and Si layers.

Figure 3A:
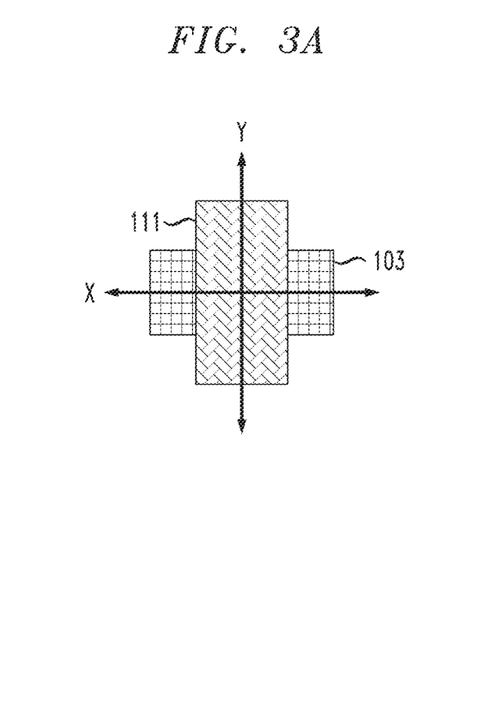
FIG. 3A is a schematic top view illustrating manufacturing of a semiconductor device and showing patterning of the stacked nanosheet layers, according to an embodiment of the invention.
Figure 3B:
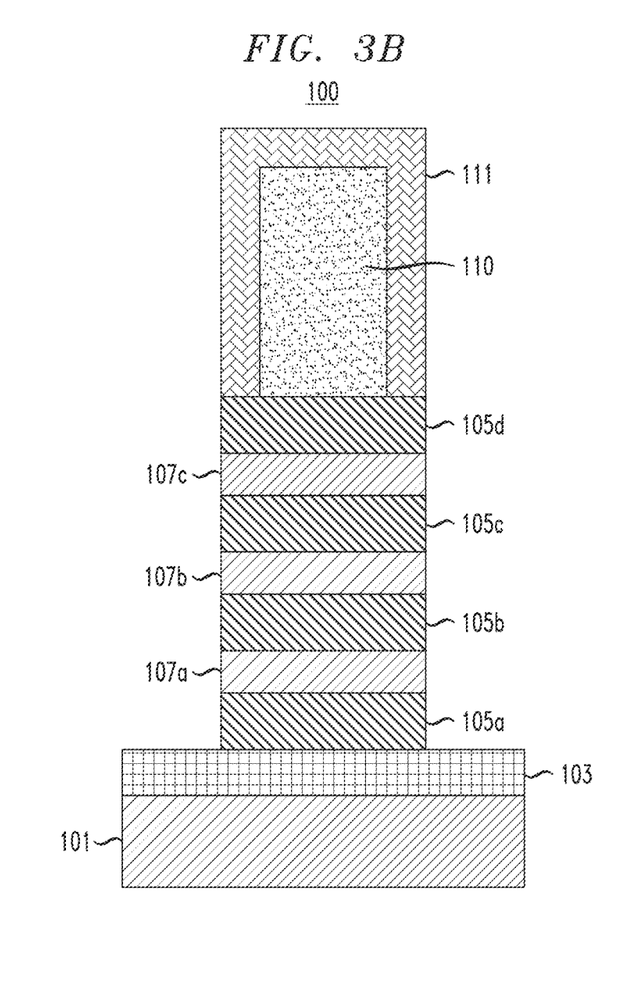
FIG. 3B is a schematic cross-sectional view taken along the line X in FIG. 3A illustrating manufacturing of a semiconductor device and showing patterning of the stacked nanosheet layers, according to an embodiment of the invention.

Referring to FIGS. 3A and 3B, exposed portions of the stacked nanosheet layers 105a-d and 107a-c, which are not under the hardmask/spacer layer 111 or dummy gate portions 110, are removed using, for example, an etching process, such as RIE, where the hardmask/spacer layer 111 and dummy gate portion 110 are used as a mask. As can be seen in FIG. 3B, the portions of the stacked nanosheet layers 105a-d and 107a-c under the hardmask/spacer layer 111 and under the dummy gate portion 110 remain after the etching process, and portions of the stacked nanosheets in areas that correspond to where source/drain regions will be formed are removed, exposing a portion of the isolation layer 103 not under the hardmask/spacer layer 111 and dummy gate portion 110. As noted above, for ease of explanation, one dummy gate structure and one patterned nanosheet stack are shown. However, the embodiments are not limited thereto, and more than one dummy gate structure and corresponding patterned nanosheet stack can be formed on a substrate 101.

Figure 4:
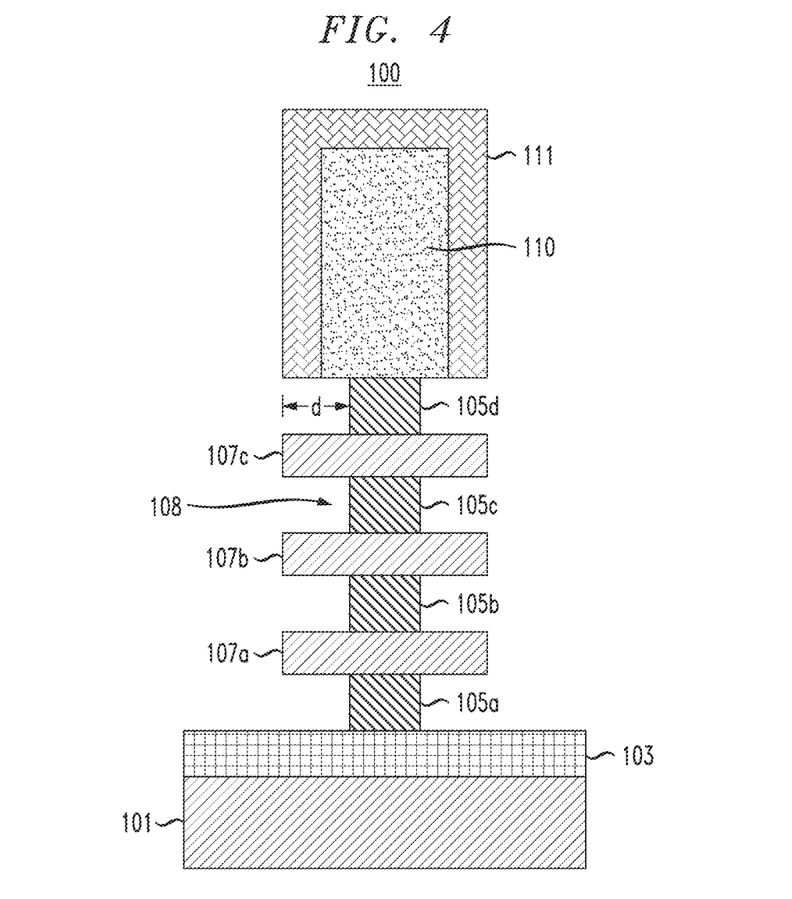
FIG. 4 is a schematic cross-sectional view illustrating manufacturing of a semiconductor device and showing lateral recessing of SiGe nanosheet layers, according to an embodiment of the invention.

Referring to FIG. 4, due to the germanium in layers 105a-105d, lateral etching of the layers 105a-105d can be performed selective to layers 107a-107c, such that the side portions of the SiGe layers 105a-105d can be removed to create vacant areas 108 to be filled in by a bilayer structure of first and second inner spacers (see FIGS. 6 and 7, elements 113' and 115), while maintaining the side portions of layers 107a-107c. Such etching can be performed using, for example, $NH_4OH:H_2O_2$ solution. The depth of the lateral recessing of the layers 105a-105d is critical to accommodating a bilayer inner spacer structure which protects source/drain regions during removal of SiGe nanosheet layers. In accordance with an embodiment, the depth d of the lateral recessing is about 8 nm to about 13 nm.

Figure 5:
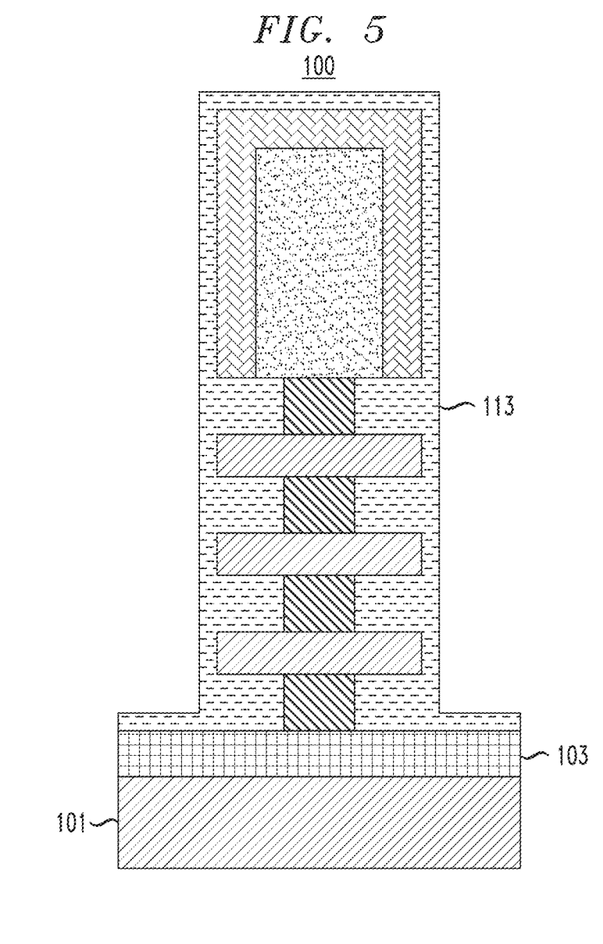
FIG. 5 is a schematic cross-sectional view illustrating manufacturing of a semiconductor device and showing conformal deposition of a first inner spacer material, according to an embodiment of the invention.

Referring to FIG. 5, first inner spacer material 113 is conformally deposited on the structure of FIG. 4 using a deposition technique such as, for example, ALD or CVD. As can be seen, the first inner spacer material layer 113 is deposited on exposed top and side portions of the hardmask/spacer layer 111, on an exposed portion of the top surfaces of the isolation layer 103, and on exposed portions of the nanosheet layers 105a-d and 107a-c. The first inner spacer material 113 is formed on lateral sides of the SiGe layers 105a-d and fills in the vacant portions left by the lateral recessing of the SiGe layers 105a-d. In accordance with an embodiment, the first inner spacer material 113 can comprise a dielectric including, but not necessarily limited to, an oxide, such as $SiO_x$, $TiO_x$, $AlO_x$, etc.

Figure 6:
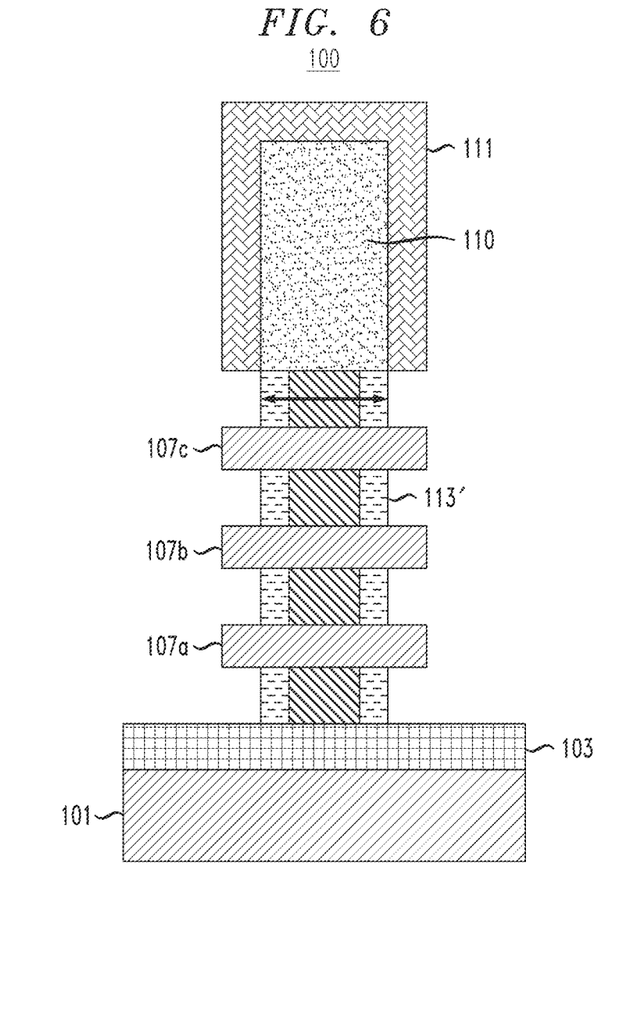
FIG. 6 is a schematic cross-sectional view illustrating manufacturing of a semiconductor device and showing removal of portions of the first inner spacer material to form first inner spacers, according to an embodiment of the invention.

Referring to FIG. 6, portions of the first inner spacer material 113 are removed to form first inner spacers 113'. According to an embodiment, an isotropic etch back process is performed to remove portions of the first inner spacer material from top and sides of the hardmask/spacer layer 111, from the top surface of the isolation layer 103, and from side portions of the Si layers 107a-c. In addition, outer portions of the inner spacer material 113 on the lateral sides of the SiGe layers 105a-d on top of and below the Si layers 107a-c are removed, resulting in the first inner spacers 113'. The arrow in FIG. 6 indicates a gate structure length following SiGe layer and first inner spacer removal (see FIGS. 12 and 13B discussed further herein). According to an embodiment, the isotropic etchback process is performed using, for example diluted hydrofluoric acid (DHF). The etch back process selectively removes the first inner spacer material 113 with respect to the hardmask/spacer layer 111, the isolation layer 103 and the Si layers 107a-c.

Figure 7:
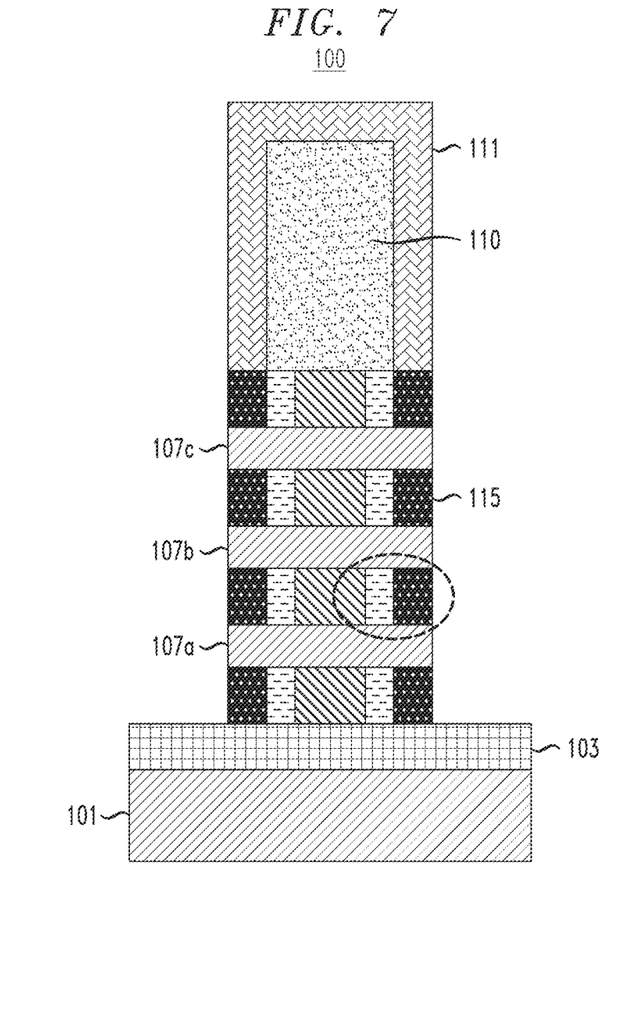
FIG. 7 is a schematic cross-sectional view illustrating manufacturing of a semiconductor device and showing formation of second inner spacers, according to an embodiment of the invention.

Referring to FIG. 7, second inner spacers 115 are formed on sides of the first inner spacers 113' in the remainder of the vacant portions 108 left after the etch back of the inner spacer material 113. The second inner spacers 115 are formed on top of and below the Si layers 107a-c. According to an embodiment, deposition of the second inner spacer material can be performed using a deposition technique including, but not necessarily limited to, ALD or CVD. Portions of the second inner spacer material are removed from horizontal surfaces, including from the top of the hardmask portion of the hardmask/spacer layer 111 on the dummy gate 110 and the nanosheet stack and from the isolation layer 103. In addition, portions of the second inner spacer material on sides of the nanosheet stack and on sides of the hardmask/spacer layer 111 are also removed, leaving the second inner spacers 115 adjacent the first inner spacers 113' and filling in the remainder of the vacant portions 108 on top of and below the Si layers 107a-c left after the etch back. In a non-limiting illustrative example, at least one embodiment of the invention includes using a removal process, such as an isotropic hot phosphorous wet etch process to perform the removal of the portions of the second inner spacer material. The circled portion in FIG. 7 illustrates the bilayer inner spacer structure of the first and second inner spacers 113' and 115. The material of the second inner spacer 115 is different from the material of the first inner spacer 113', and can comprise, but is not necessarily limited to, a nitride, such as, SiN, SiON, SiCN, BN, SiBN, SiBCN or SiOCN. As explained further herein with respect to FIG. 12, the first inner spacers 113' are selectively removed with respect to the second inner spacers 115.

Figure 8:
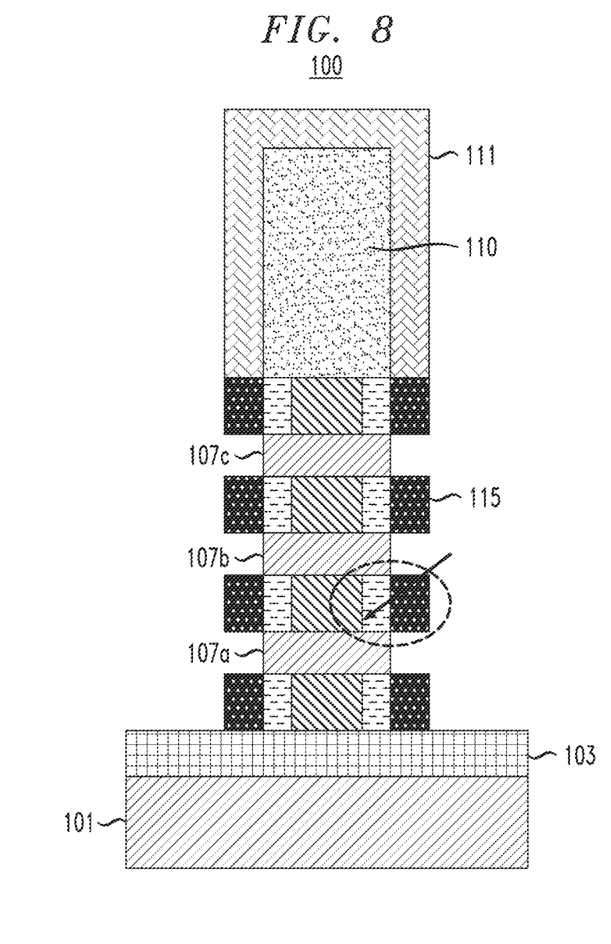
FIG. 8 is a schematic cross-sectional view illustrating manufacturing of a semiconductor device and showing lateral recessing of Si nanosheet layers, according to an embodiment of the invention.

Referring to FIG. 8, lateral etching of the layers 107a-107c is performed to remove side portions of the layers 107a-107c. Such etching can be performed using, for example, a selective Si dry etch process. The bilayer structure of inner spacers 113' and 115 protects the SiGe layers 105a-105d from being etched by the etchant performing the lateral recessing of the layers 107a-107c. Referring back to FIG. 4 and to the circled portion in FIG. 8, the original depth d of the lateral recessing of the layers 105a-105d, which is filled in by the bilayer inner spacer structure of first and second inner spacers 113' and 115, is critical to creating a large enough barrier to protect the SiGe layers 105a-105d from being etched during lateral recessing of the layers 107a-107c. Due to the presence of the bilayer inner spacer structure, the lateral recessing of the Si layers 107a-107c to remove surface oxide and other surface defects from surfaces where epitaxial growth occurs can be performed without unwanted removal of the SiGe layers 105a-105d at this stage. As can be seen in FIG. 8, according to an embodiment, the layers 107a-107c are recessed deeper than the second inner spacers 115 such that outer surfaces of the layers 107a-107c are in line with the first inner spacers 113', but not the layers 105a-105d. For example, the outer surfaces of the layers 107a-107c can be in line with the outer surfaces of the first inner spacers 113', or in line with portions of the first inner spacers 113' between lateral sides of the first inner spacers 113'. According to an embodiment, the layers 107a-107c are recessed such that outer surfaces of the layers 107a-107c are in line with portions of the second inner spacers 115 adjacent the first inner spacers 113'.

Figure 9A:
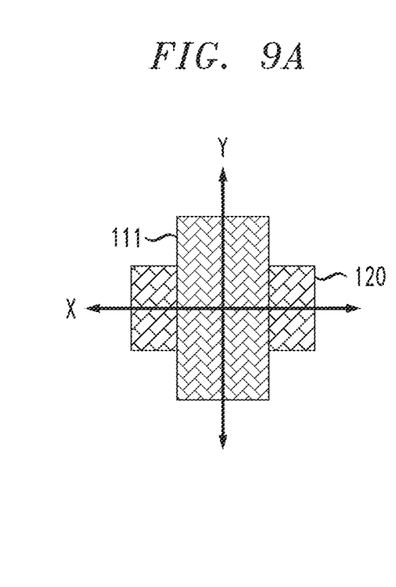
FIG. 9A is a schematic top view illustrating manufacturing of a semiconductor device and showing epitaxial growth of source/drain regions, according to an embodiment of the invention.
Figure 9B:
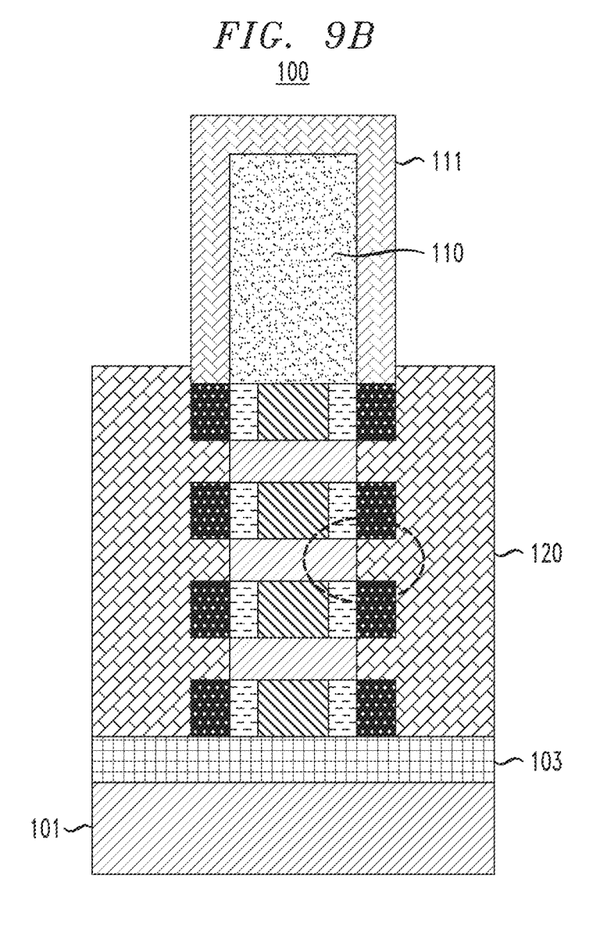
FIG. 9B is a schematic cross-sectional view taken along the line X in FIG. 9A illustrating manufacturing of a semiconductor device and showing epitaxial growth of source/drain regions, according to an embodiment of the invention.

Referring to FIGS. 9A and 9B, epitaxial source/drain regions 120 are grown from exposed sides of the Si layers 107a-107c of the nanosheet stacks. Side portions of the SiGe layers 105a-105d are covered with the bilayer inner spacer structure of first and second inner spacers 113' and 115 during epitaxial growth of source/drain regions 120 and junction formation. Due to the bilayer inner spacer structure covering the SiGe layers 105a-105d, lateral epitaxial growth does not occur from the SiGe layers 105a-105d, and as shown by the circled portion in FIG. 9B, improved source/drain junctions are formed between silicon channel regions 107a-107c and the source/drain regions 120 relative to structures where silicon channel regions 107a-107c are not laterally recessed. Lateral recessing the silicon channel regions 107a-107c before epitaxial growth provides the benefit of moving source/drain junctions closer to the channel regions without requiring a high thermal budget to diffuse the dopants, thus obtaining sharper junction profiles under the spacers 115.

According to a non-limiting embodiment of the present invention, the conditions of the epitaxial growth process for the source/drain regions 120 are, for example, RTCVD epitaxial growth using $SiH_4$, $SiH_2Cl_2$, $GeH_4$, $CH_3SiH_3$, $B_2H_6$, $PF_3$, and/or $H_2$ gases with temperature and pressure range of about 450° C. to about 800° C., and about 5 Torr-about 300 Torr. While embodiments of the present invention are described in connection with source/drain regions for a PFET comprising, for example, SiGe source/drain regions, the embodiments are not necessarily limited thereto. The embodiments can also be used in connection with the formation of source/drain regions for n-type FETs (NFETs) comprising, for example, Si source/drain regions.

After further processing, the epitaxial source/drain regions 120 become the source/drain regions for transistor devices, such as, for example, NFETs or PFETs, and can comprise in-situ phosphorous doped (ISPD) Si or Si:C for n-type devices, or in-situ boron doped (ISBD) SiGe for p-type devices, at concentrations of about $1×10^{19}/cm^3$ to about $3×10^{21}/cm^3$. By "in-situ," it is meant that the dopant that dictates the conductivity type of the doped layer is introduced during the process step, e.g., epitaxial deposition, which forms the doped layer. According to an embodiment, the epitaxial source/drain regions 120, including the junction regions between the second inner spacers 115 comprise a Ge % of at least 30% for a PFET device. An SiGe source/drain region for a PFET device provides relatively lower epitaxial region resistance and contact resistance.

Figure 10:
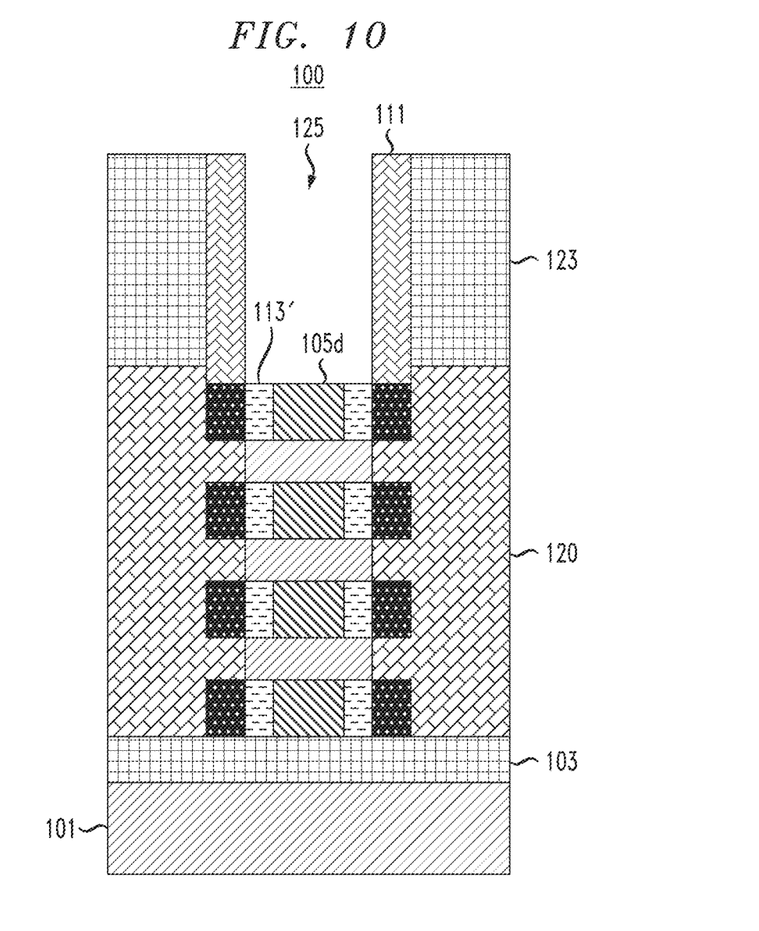
FIG. 10 is a schematic cross-sectional view illustrating manufacturing of a semiconductor device and showing inter-layer dielectric (ILD) formation and dummy gate removal, according to an embodiment of the invention.

Referring to FIG. 10, the dummy gate 110 is selectively removed to create a vacant area 125 where a gate structure including gate and dielectric portions will be formed in place of the dummy gate 110. The selective removal can be performed using, for example hot ammonia to remove a-Si, and DHF to remove the $SiO_x$. Prior to removal of the dummy gate 110, an inter-layer dielectric (ILD) layer 123 is formed on exposed portions of the source/drain epitaxial region 120, and on sides of the remaining spacer portions of the hardmask/spacer layer 111. The ILD layer 123 is deposited using deposition techniques such as, for example, CVD, PECVD, RFCVD, PVD, ALD, MBD, PLD, and/or LSMCD, followed by a planarization process, such as, CMP to remove excess portions of the ILD layer 123 deposited on top of the dummy gate portion 110 and remaining spacer portions of the hardmask/spacer layer 111. The ILD layer 123 may comprise, for example, $SiO_x$, SiOC, SiOCN or some other dielectric.

Figure 11:
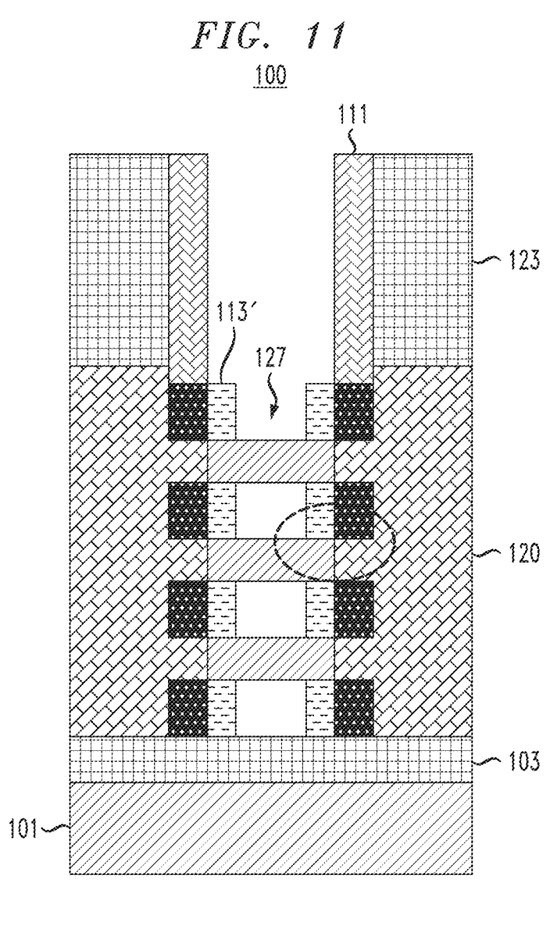
FIG. 11 is a schematic cross-sectional view illustrating manufacturing of a semiconductor device and showing removal of SiGe nanosheet layers, according to an embodiment of the invention.

Referring to FIG. 11, the SiGe layers 105a-105d are selectively removed to create vacant areas 127 where gate and dielectric portions will be formed in place of the SiGe layers 105a-105d, and also in place of the first inner spacers 113', which are subsequently removed (see FIG. 12). The layers 105a-105d are selectively removed with respect to the layers 107a-107c and the layers 111 and 113. The selective removal can be performed using, for example, a dry HCl etch. As shown by the circled portion in FIG. 11, the bilayer inner spacer structure including the first and second inner spacers 113' and 115 protects the source/drain epitaxial region 120 from being etched during removal of layers 105a-105d. The bilayer inner spacer structure blocks the etchant for removing the SiGe layers 105a-105d from reaching the source/drain epitaxial region 120, which, in the case of a PFET, may also comprise SiGe.

Figure 12:
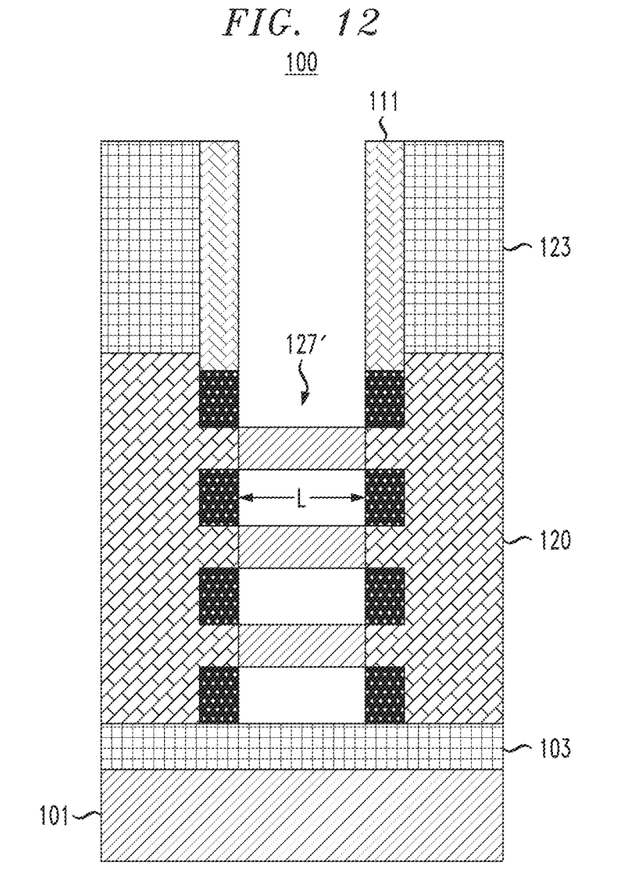
FIG. 12 is a schematic cross-sectional view illustrating manufacturing of a semiconductor device and showing first inner spacer removal, according to an embodiment of the invention.

Referring to FIG. 12, the first inner spacers 113' are selectively removed with respect to the second inner spacers 115 to form vacancies 127'. As noted previously, the first and second inner spacers 113' and 115 comprise different materials from each other so that the first inner spacers 113' (e.g., oxide) can be selectively etched with respect to the second inner spacers (e.g., nitride). The selective removal of the first inner spacers 113' can be performed using, for example, DHF. As noted previously in connection with FIG. 6, the length L of the vacant areas 127' (and of vacant area 125) indicates a length of the resulting gate structures 130 (see FIG. 13B).

Figure 13A:
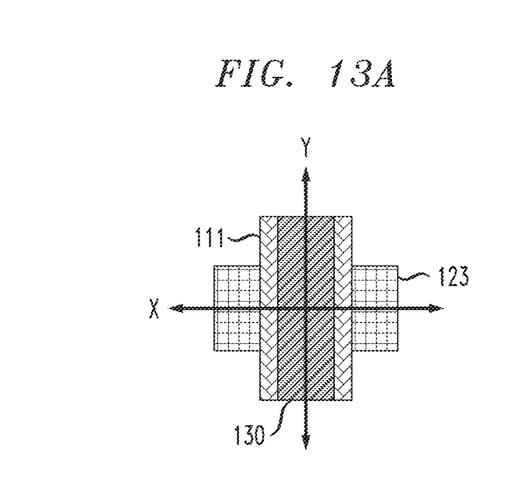
FIG. 13A is a schematic top view illustrating manufacturing of a semiconductor device and showing gate formation, according to an embodiment of the invention.
Figure 13B:
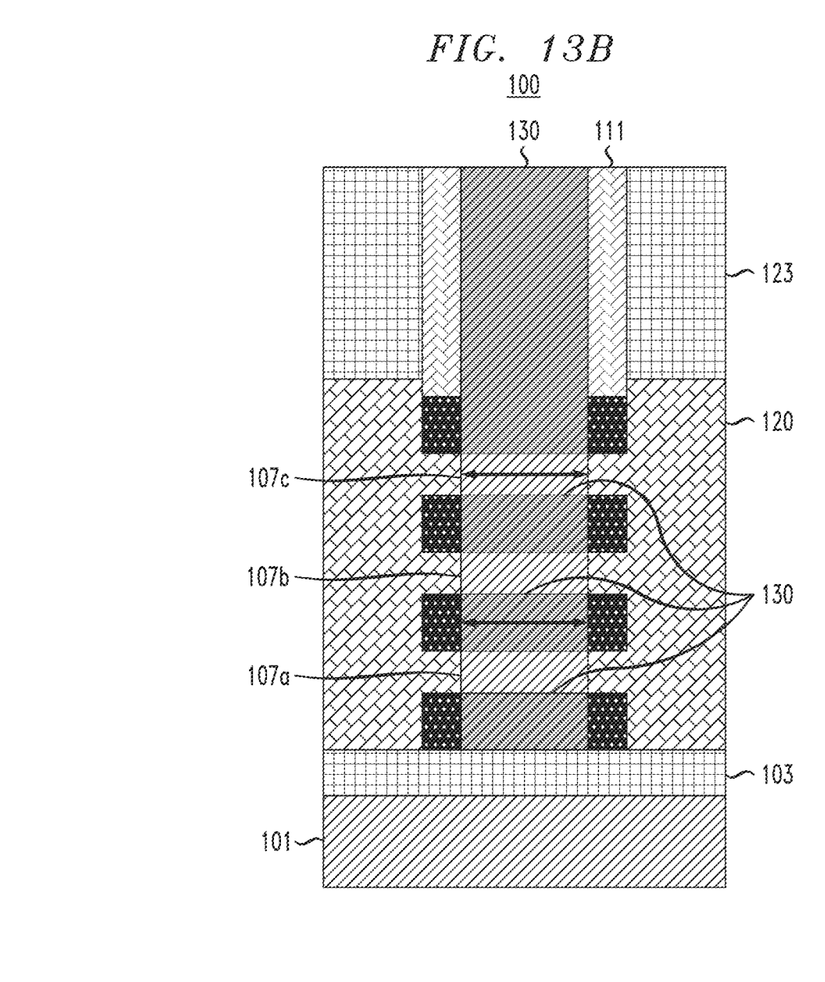
FIG. 13B is a schematic cross-sectional view taken along the line X in FIG. 13A illustrating manufacturing of a semiconductor device and showing gate formation, according to an embodiment of the invention.

Referring to FIGS. 13A and 13B, the silicon nanosheets 107a-107c are suspended, and the gate structures 130, including, for example, gate and dielectric portions are formed in the vacant portions 125 and 127' in place of the removed dummy gates 110, SiGe layers 105a-105d and first inner spacers 113'. Each gate structure 130 includes a gate dielectric layer such as, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum oxide). Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to an embodiment, the gate structures 130 each include a gate region including a work-function metal (WFM) layer, including but not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer. The gate regions can also each further include a gate metal layer including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the gate dielectric layer.

As can be seen by the arrows in FIG. 13B, the second inner spacers 115 remain on lateral sides of the gate structures 130 that replaced the SiGe layers 105a-105d. A length of the gate structures 130 is the same or substantially the same as the length of the channel layers (Si layers 107a-107c), such that surfaces of the source/drain regions 120 interfacing with surfaces of the channel layers 107a-107c are planar or substantially planar with surfaces of the gate structures 130 interfacing with surfaces of the second inner spacers 115. The length of the channel layers is measured between left and right sides of the channel layers 107a-107c in FIG. 13B. Portions of the epitaxial source/drain regions 120, where junctions to the channel layers are formed, are located between adjacent ones of the second inner spacers 115 formed above and below the epitaxial source/drain region portions.

For ease of explanation, one nanosheet/gate structure stack is shown in FIGS. 13A and 13B. However, the embodiments are not limited thereto, and more than one nanosheet/gate structure stack can be formed on a substrate 101.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

The invention claimed is:

1. A method for manufacturing a semiconductor device, comprising:
    forming a plurality of first semiconductor layers alternately stacked with a plurality of second semiconductor layers on a semiconductor substrate;
    laterally recessing the plurality of first semiconductor layers with respect to the plurality of second semiconductor layers to form a plurality of vacant areas on lateral sides of the plurality of first semiconductor layers;
    forming a plurality of first inner spacers on the lateral sides of the plurality of first semiconductor layers in respective ones of the plurality of vacant areas;
    forming a plurality of second inner spacers on sides of the plurality of first inner spacers in the respective ones of the plurality of vacant areas;
    laterally recessing the plurality of second semiconductor layers;
    growing a plurality of source/drain regions from the plurality of second semiconductor layers;
    removing the plurality of first semiconductor layers;
    removing the plurality of first inner spacers; and
    forming a plurality of gate structures in place of the removed plurality of first semiconductor layers and the removed plurality of first inner spacers.

2. The method according to claim 1, wherein the first inner spacers are selectively removed with respect to the second inner spacers.

3. The method according to claim 1, wherein the first and second inner spacers comprise different material from each other.

4. The method according to claim 1, wherein the plurality of second inner spacers fills in remaining portions of the respective ones of the plurality of vacant areas left unfilled by the plurality of first inner spacers.

5. The method according to claim 1, wherein the plurality of first semiconductor layers comprise silicon germanium and the plurality of second semiconductor layers comprise silicon.

6. The method according to claim 5, wherein the plurality of source/drain regions comprise silicon germanium.

7. The method according to claim 1, wherein the plurality of second semiconductor layers are laterally recessed to a depth such that outer surfaces of the plurality of second semiconductor layers are in line with the plurality of first inner spacers.

8. The method according to claim 1, further comprising forming a dummy gate structure on the plurality of first semiconductor layers alternately stacked with the plurality of second semiconductor layers.

9. The method according to claim 8, further comprising removing portions of the plurality of first and second semiconductor layers using the dummy gate structure as a mask.

10. A method for manufacturing a semiconductor device, comprising:
    forming a plurality of first semiconductor layers alternately stacked with a plurality of second semiconductor layers on a semiconductor substrate;
    laterally recessing the plurality of first semiconductor layers with respect to the plurality of second semiconductor layers to form a plurality of vacant areas on lateral sides of the plurality of first semiconductor layers;
    forming a plurality of first inner spacers on the lateral sides of the plurality of first semiconductor layers in respective ones of the plurality of vacant areas;
    forming a plurality of second inner spacers on sides of the plurality of first inner spacers in the respective ones of the plurality of vacant areas;
    laterally recessing the plurality of second semiconductor layers; and
    growing a plurality of source/drain regions from the plurality of second semiconductor layers;
    wherein forming the plurality of first inner spacers comprises:
        depositing a first inner spacer material to fill in respective ones of the plurality of vacant areas; and
        etching the deposited first inner spacer material to remove a portion of the deposited first inner spacer material from the filled-in respective ones of the plurality of vacant areas.

11. The method according to claim 10, wherein the plurality of second inner spacers fills in remaining portions of the respective ones of the plurality of vacant areas following the etching of the deposited first inner spacer material.

12. The method according to claim 10, wherein the first and second inner spacers comprise different material from each other.

13. A method for manufacturing a semiconductor device, comprising:
    forming a plurality of sacrificial semiconductor layers alternately stacked with a plurality of channel semiconductor layers on a semiconductor substrate;
    laterally recessing the plurality of sacrificial semiconductor layers with respect to the plurality of channel semiconductor layers to form a plurality of vacant areas on lateral sides of the plurality of sacrificial semiconductor layers;
    forming a plurality of first inner spacers on the lateral sides of the plurality of sacrificial semiconductor layers in respective ones of the plurality of vacant areas;

forming a plurality of second inner spacers on sides of the plurality of first inner spacers in the respective ones of the plurality of vacant areas;
laterally recessing the plurality of channel semiconductor layers;
growing a plurality of source/drain regions from the plurality of channel semiconductor layers;
removing the plurality of sacrificial semiconductor layers;
removing the plurality of first inner spacers; and
forming a plurality of gate structures in place of the removed plurality of sacrificial semiconductor layers and the removed plurality of first inner spacers.

14. The method according to claim 13, wherein the first inner spacers are selectively removed with respect to the second inner spacers.

15. The method according to claim 13, wherein the first and second inner spacers comprise different material from each other.

16. The method according to claim 13, wherein forming the plurality of first inner spacers comprises:
depositing a first inner spacer material to fill in respective ones of the plurality of vacant areas; and
etching the deposited first inner spacer material to remove a portion of the deposited first inner spacer material from the filled-in respective ones of the plurality of vacant areas.

17. The method according to claim 16, wherein the plurality of second inner spacers fills in remaining portions of the respective ones of the plurality of vacant areas following the etching of the deposited first inner spacer material.

18. The method according to claim 13, wherein the plurality of second inner spacers fills in remaining portions of the respective ones of the plurality of vacant areas left unfilled by the plurality of first inner spacers.

19. The method according to claim 13, wherein the plurality of sacrificial semiconductor layers comprise silicon germanium and the plurality of channel semiconductor layers comprise silicon.

20. The method according to claim 19, wherein the plurality of source/drain regions comprise silicon germanium.

* * * * *